(12) United States Patent
Tung et al.

(10) Patent No.: US 6,475,327 B2
(45) Date of Patent: Nov. 5, 2002

(54) ATTACHMENT OF A STIFF HEAT SPREADER FOR FABRICATING A CAVITY DOWN PLASTIC CHIP CARRIER

(75) Inventors: I-Chung Tung, Hsinchu (TW); Jiun-Shian Yu, TaiChung (TW); Kuo-Bin Chen, ChiaYi (TW); Shih-Ping Hsu, TaoYuan (TW)

(73) Assignee: Phoenix Precision Technology Corporation (TW)

( * ) Notice: Subject to any disclaimer, the term of this patent is extended or adjusted under 35 U.S.C. 154(b) by 14 days.

(21) Appl. No.: 09/827,049

(22) Filed: Apr. 5, 2001

(65) Prior Publication Data

US 2002/0144775 A1 Oct. 10, 2002

(51) Int. Cl.⁷ ............................................. H01L 23/32
(52) U.S. Cl. .................... 156/306.6; 257/706; 257/712; 257/713
(58) Field of Search ........................ 29/832, 739, 740; 257/706, 713, 712, 738; 156/306.6, 297, 298, 299

(56) References Cited

U.S. PATENT DOCUMENTS

| 3,868,770 | A | * | 3/1975 | Davis et al. ................... 29/626 |
| 6,034,427 | A | * | 3/2000 | Lan et al. ..................... 257/698 |
| 6,060,778 | A | * | 5/2000 | Jeong et al. ................. 257/710 |
| 2002/0009826 | A1 | * | 1/2002 | Chien .......................... 438/106 |

\* cited by examiner

Primary Examiner—Michael W. Ball
Assistant Examiner—Vivek Koppikar

(57) ABSTRACT

A stiff heat spreader element for making a cavity down plastic chip carrier having benefits of excellent heat dissipation property, low weight, small thickness, low warpage and low twist is disclosed. The stiff heat spreader element is formed by bonding a heat spreader and a thermally conductive sheet with using a first bonding sheet. The first bonding sheet is a prepreg or prepregs made of fiber-reinforced resin. A second bonding sheet is used to bond a circuit substrate and the stiff heat spreader element. The second bonding sheet is made of a single adhesive layer or a stack of adhesive layers. The adhesive layer is made of an adhesive material, or a flake-filled adhesive material, or short fiber-filled adhesive material, or a particle-filled adhesive material. The second bonding sheet is not a prepreg or prepregs. The circuit substrate has an opening to receive an electronic chip.

40 Claims, 4 Drawing Sheets

ATTACHMENT OF A STIFF HEAT SPREADER FOR FABRICATING A CAVITY DOWN PLASTIC CHIP CARRIER

BACKGROUND OF THE INVENTION

1. Field of the Invention

This invention relates generally to fabrication of the electronic packages, including single-chip packages and multichip packages, and in particular, to fabrication of a plurality of cavity down chip packages having heat spreaders which also function as stiffeners attached thereto.

2. Description of the Prior Art

With continuing advances in the semiconductor industry, electronic circuitry and electronic packaging are often designed to utilize as little space as is practicable. Circuit space often is a valuable asset, which needs to be conversed, and a miniaturization of electronic circuits often improves speed, reduces noise and leads to other performance advantages. Such a miniaturization is desirable in electronics employed in various applications, such as aircraft, automobiles, cellular phones, hand carry computers, hand carry camcorders, etc. However, heat density problems often arise with increased miniaturization, since the amount of heat generated by the device increases as the number of transistors fabricated onto a single semiconductor device increases.

One type of semiconductor chip package includes one or more semiconductor chips attached to a substrate, e.g. a ceramic substrate or a plastic substrate, wherein a ceramic substrate uses ceramic material as the insulating layers while a plastic substrate uses a plastics-based material as the insulating layers. Such a semiconductor chip package, conventionally termed a chip carrier, is generally interconnected on a printed circuit card or printed circuit board. Chips can be attached to the substrate in several ways. Currently, the most popular way is wire bonding, in which electrical connections are made by attaching very small wires from the device side of the chip to the appropriate points on the substrate. Another way of attachment uses small solder balls to both physically attach the chip and make required electrical connections, which is so called flip chip bonding.

Assorted methods have been employed to mount integrated circuit chips in plastic packages for a lower cost packaging means as compared with ceramic packages. While the plastic packages are further recognized to provide several important advantages for the chip operation as compared with ceramic packages, including higher current carrying capacity, lower dielectric constant for short operational delay times, along with reduced inductance and capacitance. However, low temperature stability experienced with plastic packages still remains as a problem. This issue has gained much attention in the development of modem plastic packages. One solution to this issue is to adopt a cavity down chip package structure, in which a heat slug or a heat spreader is attached to the bottom of the package and the chip is mounted in a recess cavity!with its open side facing toward the printed circuit card or printed circuit board.

FIG. 1 illustrates a typical cavity down chip carrier 100. It includes a plastic wiring substrate 101 with a recess cavity 102 and a heat slug or heat spreader 103 bonded to said substrate 101 with assistance of a bonding layer 104. A side-wall electrically and/or thermally conductive layer 105 may be made to connect the heat spreader with the wiring layer in said substrate 101 for further enhanced thermal or electrical performance. A chip 106 is mounted on the heat spreader 103 inside the recess cavity 102. The conductive wires 107 are used to interconnect the chip 106 to the substrate 101. After the wire bonding process, the cavity 102 is filled up with an encapsulant 108 to cover and protect the bonding wires 107 and chip 106 against environmental degradation. The external connection means 109, by which the substrate 101 is electrically connected to a printed circuit board 110, are attached to appropriate areas on the top surface of the substrate 101. The external connection means 108 may be conductive pins or solder balls or columns as utilized in plastic pin grid array (PPGA) or plastic ball grid array (PBGA) or plastic column grid array (PCGA). As an alternative structure, an additional heat sink may be attached to the backside of the heat spreader 103 if necessary for further enhancing heat dissipation.

In order to overcome warparge or twist in making a cavity down plastic chip carrier, a stiffener or more copper layers may sometimes be embedded. A typical example is shown in FIG. 2. A prior art cavity down plastic chip carrier, so called super ball grid array package, includes a circuit substrate 201 having a first surface 201a and a second surface 201b opposite the first surface and an internal copper layer 202 on the first surface 202a of which is attached to the second surface 201b of the circuit substrate 201 by means of an adhesive 203. On the respective central portions of the circuit substrate 201 and the copper layer 202 are formed an opening so that the opening forms a recess cavity 204 through the circuit substrate 201 and the copper layer 202. A heat spreader 205 is attached to the other surface 202b of the copper layer 202 with using an adhesive 206 for improving the heat dissipation characteristics. A chip 207 is mounted on the heat spreader 205 inside the recess cavity 204 with assistance of an adhesive 208. The conductive wires 209 are used to interconnect the chip 207 to the substrate 201. After the wire bonding process, the cavity 204 is filled up with an encapsulant 210 to cover and protect the bonding wires 209 and chip 207 against environmental degradation. The solder balls 211, by which the substrate 201 is electrically connected to :a printed circuit board 212, are attached to appropriate areas on the first surface 201a of the substrate 201. As an alternative structure, an additional heat sink may be attached to the second surface 205b of the heat spreader 205 if necessary for further enhancing heat dissipation.

U.S. Pat. No. 6,034,427 (J. J. D Lan et al.) teaches the use of a stiffener for a plastic cavity down BGA, in which the stiffener is first attached to a circuit board with assistance of a prepreg and then a heat spreader is attached to the stiffener by using an adhesive film. In this method, when the heat spreader is made of copper base material, e.g. copper or copper base alloy, which is well known a relatively soft material, the cure shrinkage of the adhesive film may cause warpage during heat pressing the heat spreader together with the circuit board containing the stiffener.

U.S. Pat. No. 6,060,778 (T. S. Jeong et al.) also teaches a similar method for making a plastic cavity down BGA, which states that the BGA package has excellent heat dissipation capability, a low weight, a thinner thickness and a low manufacturing cost. The method involves the use of a first thermally conductive layer, which is attached to a circuit substrate. A second thermally conductive layer (i.e. a heat spreader) is attached to the circuit substrate containing the first thermally conductive layer. However, the method is depicted in the FIG. 7 of the said patent but not included in the claims of the said patent. This method would encounter the same problem as described above for U.S. Pat. No. 6,034,427, i.e. warpage of the fabricated BGA is difficult to be eliminated.

It is therefore an object of the present invention to provide a method to make a plastic cavity down chip carrier having excellent heat dissipation capability, a low weight, absence of warpage and twist, and low manufacturing cost. Briefly, the present invention provides a method for first bonding two or more thermally conductive sheets to form a stiff heat spreader element and second bonding the stiff heat spreader element with a circuit board (or say integrated circuit substrate). This method is clearly different from the methods proposed by the U.S. Pat. Nos. 6,034,427 and 6,060,778, since both prior methods bond a first thermally conductive sheet with a circuit board and then bond a second thermally conductive sheet to the circuit board which already carries the; first thermally conductive sheet. There is one more clearly different point. That is, the method in the present invention proposes to use a prepreg or prepregs as the adhesive layer for bonding the thermally conductive sheets and a non-prepreg material as the adhesive layer for bonding a thermally conductive sheet with a circuit board, whereas the method propose by U.S. Pat. No. 6,034,427 uses a non-prepreg material as the adhesive layer for bonding the thermally conductive sheets and a prepreg for bonding a thermally conductive sheet with a circuit board. According to the present invention, the use of a prepreg for bonding the thermally conductive sheet can form a very stiff heat spreader element. After the stiff heat spreader element is attached to a circuit board, the stiff heat spreader element is able to function as a stiffener for the resultant cavity down chip carrier, so that warpage and twist of the resultant cavity down chip carrier could be greatly alleviated.

SUMMARY OF INVENTION

It is therefore an objective of the present invention to provide a stiff heat spreader element for making a cavity down plastic chip carrier having benefits of excellent heat dissipation characteristic, low weight, small thickness and low warpage and twist.

Another objective of the present invention is to adopt a first bonding sheet for bonding a first thermally conductive sheet and a second thermally conductive sheet to form a first stiff heat spreader element. The first bonding sheet with any configuration is a prepreg or prepregs based on a fiber-reinforced resin. The second thermally conductive sheet has an opening for receiving an electronic chip and the electronic chip can be directly attached onto the surface of the first thermally conductive sheet.

Another further objective of the present invention is to adopt a second bonding sheet for bonding a plastic circuit board having an opening for receiving an electronic chip and the first stiff heat spreader element. The second bonding sheet with any configuration is made of a single adhesive layer or a stack of more adhesive layers. The adhesive layer is made of an adhesive material, a flake-filled adhesive material, a fiber-filled material, or a particle-filled material. The adhesive layer is not a prepreg.

Another further objective of the present invention is the provision of a second stiff heat spreader element formed by stacking a first thermally conductive sheet and two or more second thermally conductive sheet with the use of the first bonding sheet is between the thermally conductive sheets. The first bonding sheet with any configuration is a prepreg or prepregs based on a fiber-reinforced resin. The second thermally conductive sheets having openings for receiving an electronic chip and the electronic chip can be directly attached onto the surface of the first thermally conductive sheet.

Another further objective of the present invention is to adopt a second bonding sheet for bonding a plastic circuit board having an openings for receiving an electronic chip and the second heat spreader element. The second bonding sheet with any configuration is made of a single adhesive layer or a stack of more adhesive layers. The adhesive layer is made of an adhesive material, a flake-filled adhesive material, a fiber-filled adhesive material, or a particle-filled adhesive material. The adhesion layer is not a prepreg or prepregs.

DETAILED DESCRIPTION OF A PREFERRED EMBODIMENT

For a better understanding on the advantages and capabilities of the present invention, reference is made to the following disclosure, appended claims in connection with the accompanying drawings. This invention, however, is embodied in many different forms and should not be construed as limited to the embodiments set forth herein. Rather, these embodiments are provided so that this disclosure will be thorough and complete, and will fully convey the scope of the invention to those skilled in the art.

The invention provides a stiff heat spreader that is further able to function as a stiffener for making a cavity down plastic chip carrier being devoid of warpage and twist. At the same time the efficiency of heat dissipation can even be higher. The method will be detailed hereinafter. Like numbers refer to like elements throughout. However, the figures are simply illustrative of the process, and are not drawn to scale, i.e. they do not reflect the actual dimensions or features, of the various layers in the chip carrier structure.

Figure 3:
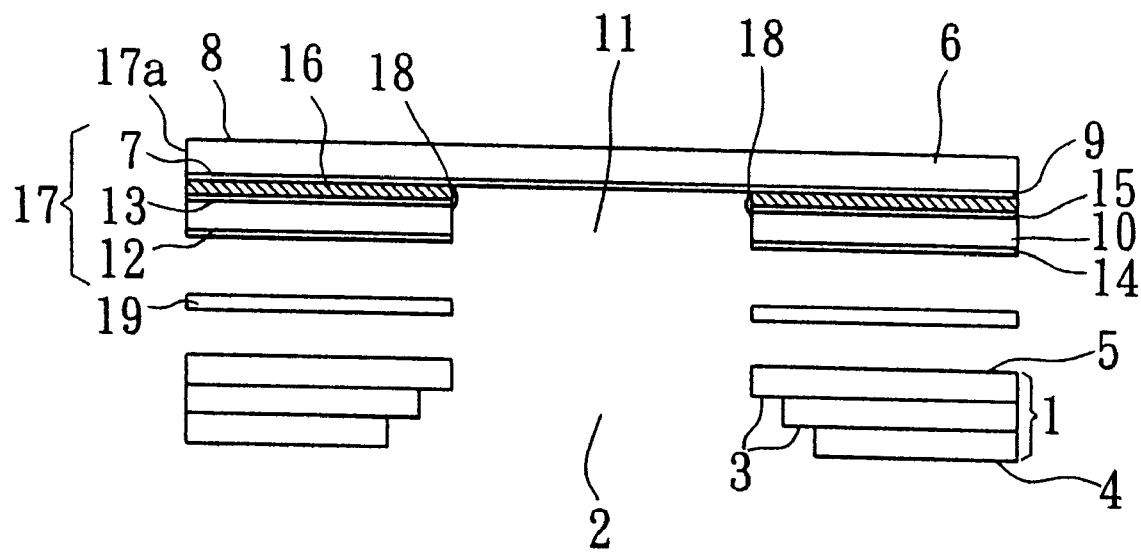
FIG. 3 is an exploded view showing the layers used to construct a cavity down chip carrier having a heat spreader element in accordance with one embodiment of the present invention

Now referring to FIG. 3, in accordance with a preferred embodiment of the present invention, there is initially provided a plastic chip carrier substrate 1 with an opening 2 and several tiers 3. Said substrate 1 may have wiring circuit layers separated by organic insulating layers, through-holes, conductive through holes, vias in said substrate 1, electrodes (or say bond fingers) and protective layers on the surfaces of said tiers 3, electrodes (or say landing pads), dam, and protective coating on the first surface 4, and electrodes and protective coating on the second surface 5, all of which are well-known techniques in the art. A first thermally conductive sheet 6 (or say heat spreader), e.g. made of copper, copper alloy, aluminum, aluminum alloy, graphite fiber-reinforced copper or copper alloy, or silicon carbide particle-filled copper or copper alloy, etc., may be surface roughened chemically or physically on both surfaces, i.e. the first surface 7 and second surface 8. On said first surface 7, an adhesion promoter layer 9, e.g. an oxide layer or a coupling agent, is deposited to enhance adhesion property. A coupling agent may comprise silane coupling agent, titanium coupling agent, zirconium coupling agent, or aluminum coupling agent, etc. A second thermally conductive sheet 10 (or say interior thermally conductive sheet), e.g. made of copper, copper alloy, aluminum, aluminum alloy, graphite fiber-reinforced copper or. copper alloy, or silicon carbide particle-filled copper or copper alloy, etc., with a hole 11 through the sheet 10, may be surface roughened chemically or physically on both surfaces, i.e. the first surface 12 and second surface 13. On said surfaces 12 and 13, the adhesion promoter layers 14 and 15 are also deposited respectively to enhance adhesion property. However, according to this present invention, said adhesion promoter is not limited to an oxide or a coupling agent. Said first surface 7 of said heat spreader 6 is laminated to said first surface 12 of said interior thermally conductive sheet 10 with assistance of an a first bonding sheet 16, which is preferably a fiber-reinforced resin, e.g. a prepreg or the prepregs. After heat pressing, a stiff heat spreader element 17 comprising said heat spreader 6 and said interior thermally conductive sheet 10 together with said first bonding sheet is thus accomplished. Said stiff heat spreader element 17 is a stiff sandwich structure since said first bonding sheet 16, e.g. a prepreg, becomes relatively stiff after heat pressing. It is to be noted that said first thermally conductive sheet 6 and said second thermally conductive sheet 10 preferably have the same thickness, whose symmetric sandwich structure would give the best mechanical property for prohibiting occurrence of warpage and twist problems. A thermally or electrically conductive layer 18 also may be deposited to thermally connect said heat spreader 6 with said interior thermally conductive sheet 10 for further enhancing heat dissipation.

Figure 2:
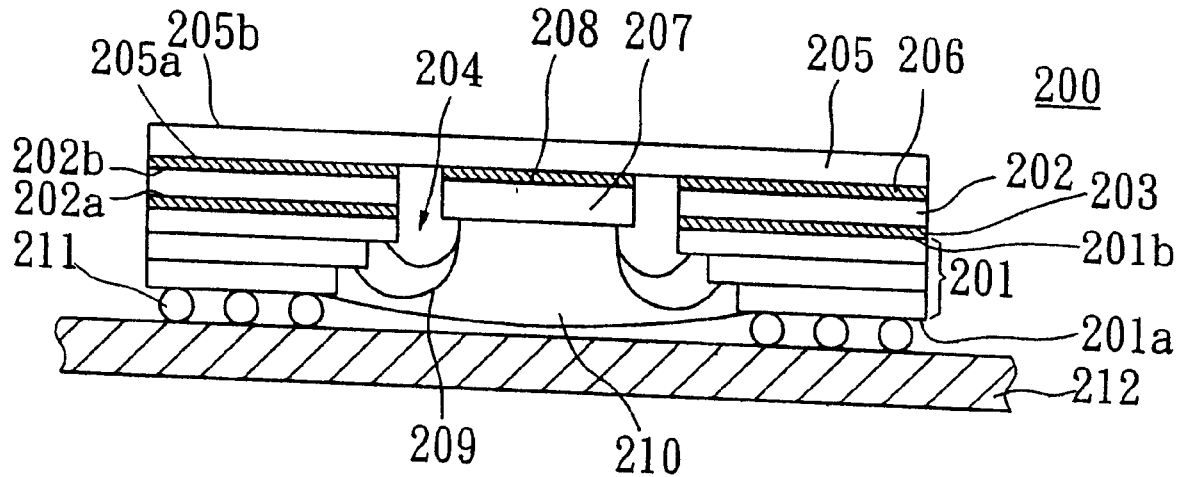
FIG. 2 is a cross-sectionalview of a prior art cavity down chip carrier having an embedded stiffener
Figure 4:
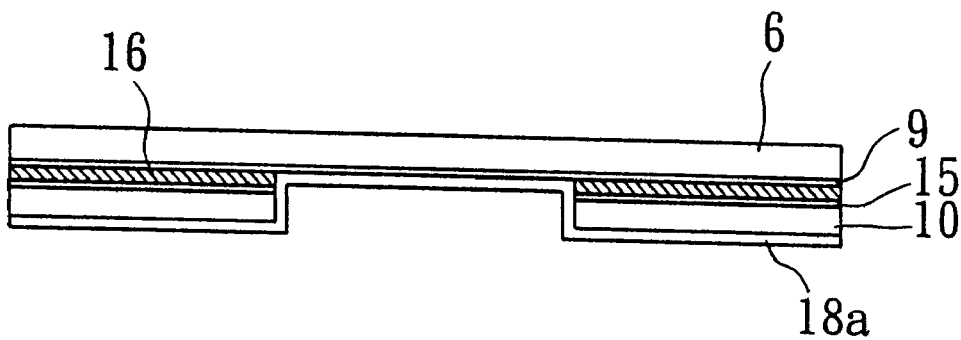
FIG. 4 is a cross-sectional view of a heat spreader element in accordance with one embodiment of the present invention

As an alternate way, in accordance with a preferred embodiment of the present invention, a thermally or electrically conductive layer 18a, e.g. a thin copper layer, may be deposited on the surface of said stiff heat spreader element 17, as illustrated in FIG. 4. Surely, it is preferably to acid clean or plasma clean the surface up before the deposition of said layer whether 18 or 18a. On said second surface 8 of said heat spreader 6, a protective coating, e.g. nickel, gold, thermally conductive particle-filled, epoxy resin, diamond, or diamond like carbon, etc., may also be formed. Normally, said second surface 8 may be surface roughened chemically or physically before the deposition of said protective coating. A second bonding sheet 19 is placed in between said second surface 5 of said substrate 1 and said first surface 12 of said interior thermally conductive sheet 10. By pressing, said element 17 is bonded to said second surface 5 of said substrate 1 after said second bonding sheet 19 is hardened by a means, such as heat or radiation, etc. However, one may recognize that said first and second bonding sheets 16 and 19 are not limited to any shape or configuration. After side-wall plating, die attachment, wire bonding, encapsulant filling, and external terminal attachment processes, which are well-known techniques in the art, are finished, a cavity down chip carrier 200 shown in FIG. 2 can thus be constructed.

It is to be understood that a particular feature, as illustrated in FIG. 4, a thin thermally conductive layer 18a is deposed to thermally connect said first thermally conductive sheet 6 and said second thermally conductive sheet 10, whereby better thermal performance for the resultant cavity down chip carrier is obtained. However, this advantageous result with better thermal performance can not be obtained through the method proposed by the U.S. Pat. No. 6,060,778, since the prior method bonds first a thermally conductive sheets to a circuit board, unlike the method proposed by the present invention, which bonds first the thermally conductive sheets to form a heat spreader element before attachment of a circuit board.

Said plastic chip carrier substrate 1 may be a single-layer or multilayer substrate having a plurality of overlapping alternating layers of dielectric material (i.e. for forming insulating layer) and conductive material, wherein said organic dielectric material is an organic material or a fiber-reinforced organic material or a particle-reinforced organic material, etc., for example, epoxy resin, polyimide, bis-meleimide triazine, cyanate ester, polybenzocyclobutene, or glass fiber composite thereof, etc. Said plastic chip carrier substrate 1 is preferably formed before bonded to said element 17, so that said conductive through-holes completely penetrating through said substrate 1 can be made for forming a cavity down chip carrier 200. In such a case, cure shrinkage occurring during the formation of said substrate 1 will not be able to induce any warparge or twist when said substrate 1 is bonded to said element 17.

Figure 1:
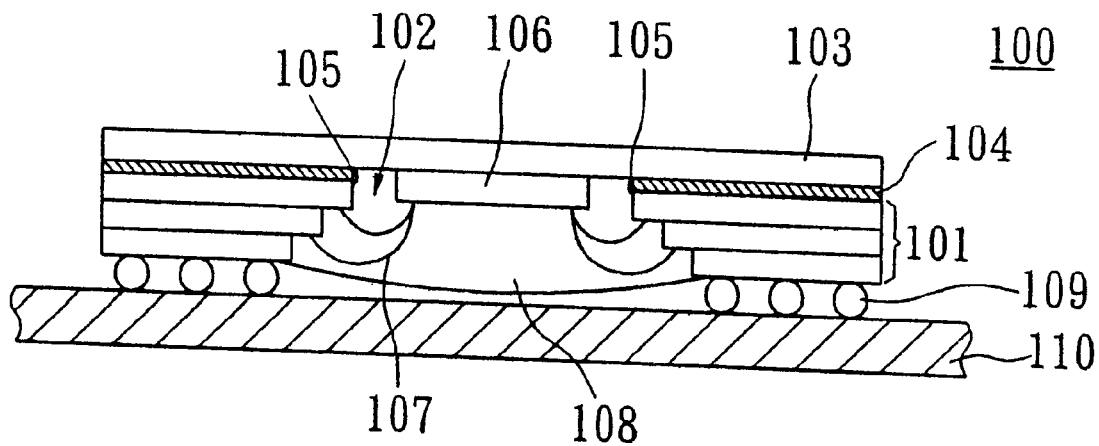
FIG. 1 is a cross-sectional view of a prior art cavity down chip carrier based on wiring bond techniques

Referring to FIG. 1, said heat spreader 103 is generally made of copper or copper base alloy. It is known in the practical operation that a copper sheet will become soft when the operating temperature approaches about 300–400° C. According to the practical experiences, if said heat spreader 103 made of copper is too thin, e.g. less than 0.5 millimeters, it will be very difficult to handle said heat spreader 103 during the manufacturing process of making said plastic chip carrier 100 due to easy deformation of said heat spreader 103. It is therefore that the thickness of said heat spreader 103 made of copper is preferably larger than 0.5 millimeters. However, when the thinner heat spreader 103 is needed, i.e. less than 0.5 millimeter, a copper base alloy used to form said heat spreader 103, which has a higher mechanical strength, is preferred. The content of the alloy elements of said copper base alloy is better less than 5 wt % (weight percent of the total weight of said copper base alloy), e.g. C194 or C305 copper alloy, preferably less than 0.5 wt %, e.g. C151 copper alloy, since a higher content of added alloy elements would give a lower thermally conductivity of said. copper base alloy. It is to be noted here that copper in the present invention is meant a copper alloy with a content of the incidental alloy elements less than 0.1 wt %.

However, the limitation of the thickness of said heat spreader 103 made of copper larger than 0.5 millimeter can be released, when said sandwich element 17 is used. For example, said copper heat spreader 6 with a thickness of 0.254 millimeter laminated to said interior thermally conductive copper sheet 10 with a thickness of 0.254 millimeter using a prepreg is able to form said element 17, which is hard and thick enough and easily adapted to the manufacturing process of making a cavity down chip carrier 200. Said first bonding sheet 16 between said heat spreader 6 and said interior thermally conductive sheet 10 could also be two or more prepregs, if the higher mechanical strength of said element 17 is required to overcome warpage problem of the resultant chip carrier. It is also preferable that both said first and second thermally conductive sheets have the same thickness, which has been proven to give the best results in improving of the warpage problem.

In order to protect said element 17 more fully from environmental corrosion, the side walls of said element 17 may also be coated with a protective layer 17a, e.g. nickel, gold, epoxy resin, etc. When metal coating is deposited on said side wall, the thermally dissipation is further enhanced at the same time, since the surface area for heat dissipating is increased.

In accordance with a preferred embodiment of the present invention, said second bonding sheet 19 is made of an adhesive layer or a stack of more adhesive layers. Said adhesive layer is made of an adhesive material, short fiber-filled adhesive material, flake-filled adhesive material, or particle filled adhesive material. Since woven fibers are not filled in said adhesive material, said adhesive layer will not be a prepreg in the present invention. Examples of said adhesive material can be a resin, e.g. epoxy resin, polyimide resin, polyurethane, and acrylic resin, etc., a copolymer, e.g. epoxy-acrylic resin, epoxy-butadiene resin, and epoxy-urethane resin, etc., a polymer blend, e.g. epoxy resin/halogenated polyhydroxystyrene blend, and epoxy resin resin/phenolic resin blend, etc. Said organic material can be also modified by silicone, halogen, or phosphite, etc. Short fibers, made of metal, organic or inorganic material, such as tungsten short fibers, aramid short fibers, glass short fibers, etc., can be filled in said organic materials for enhancing mechanical strength or reducing thermally coefficient of expansion of said second bonding sheet. Flakes or particles can also be filled in said organic material for the same purpose. Examples of flakes may be silver flakes or graphite flakes, while examples of particles may be silica particles, barium sulfate particles, clay, calcium carbonate particles, melamine particles, polystyrene particles, copper particles, or silver particles, etc. Said adhesive material my also contain some other additives, such as chemical catalysts, antioxidants, rheological agents, coupling agents, and color agents, etc.

The selection of said adhesive layer is also essential for eliminating warpage and twist problem of making a cavity down plastic chip carrier. In the today's industrial activity, said adhesive: material made on the basis of a thermosetting resin has been the main stream. Said typical thermosetting resin is usually hardened at an elevated temperature and cooled down to room temperature. Therefore, it is preferable that said adhesive material is sufficiently soft (i.e. with low mechanical modulus) to compensate cure shrinkage occurring at the curing stage. Normally, partially curing said thermosetting resin before bonding and lowering down CTE and mechanical modulus of said adhesive material are helpful for good bonding without warpage and twist problems. According to the practical experiences, a prepreg with a high mechanical modulus in essence is difficult to obtain good bonding without warpage for a cavity down chip carrier. For achieving good bonding without warpage, whether too high filler loading to give a higher mechanical modulus or too low filler loading to give a high CTE should be avoided. Besides, the CTE of said adhesive layer is preferably lower than 150 ppm/°C., more preferably lower than 100 ppm/°C., most preferably lower than 50 ppm/°C.

Figure 5:
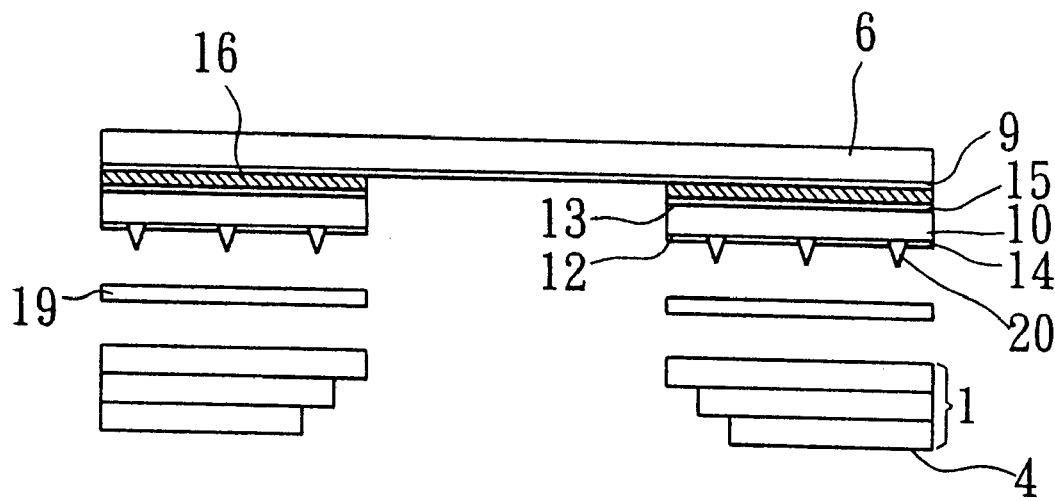
FIG. 5 is an exploded view showing the layers used to construct a cavity down chip carrier having embedded sharp-edged connectors in accordance with one embodiment of the present invention

In accordance with a preferred embodiment of the present invention, said stiff heat spreader element may have sharp-edged connectors sticking out of said stiff heat spreader element. As illustrated in FIG. 5, the sharp-edged connectors 20 are formed on said first surface 12 of said interior thermally conductive sheet 10. An adhesion promoter 14, e.g. an oxide layer or a coupling agent, is also made on the same surface 12. Using pressure and heat, said sandwich element 17 is bonded to said circuit substrate 1 with assistance of said second. bonding sheet 19. At the same time, said sharp-edged connectors 20 would penetrate said bonding sheet 19 and contact the prearranged contact pads, on said second surface 5 of said circuit substrate 1. Certainly, the holes may be made by laser or mechanical drilling, etc., at the predetermined connection positions before. bonding, which may help said connectors 20 to easily penetrate through said bonding sheet 19. Said sharp-edged connectors 20, which are electrically conductive or thermally conductive, may be. of any shape and configuration. This kind of the connection makes said sandwich element 17 to act as a ground potential especially when electrically connected to the ground plane(s) and provides a heat conduction path for conducting a heat generated by the transistors to said sandwich element 17 therethrough, which would further improve electrical and thermal performance of the resulting plastic cavity down chip carrier.

Figure 6:
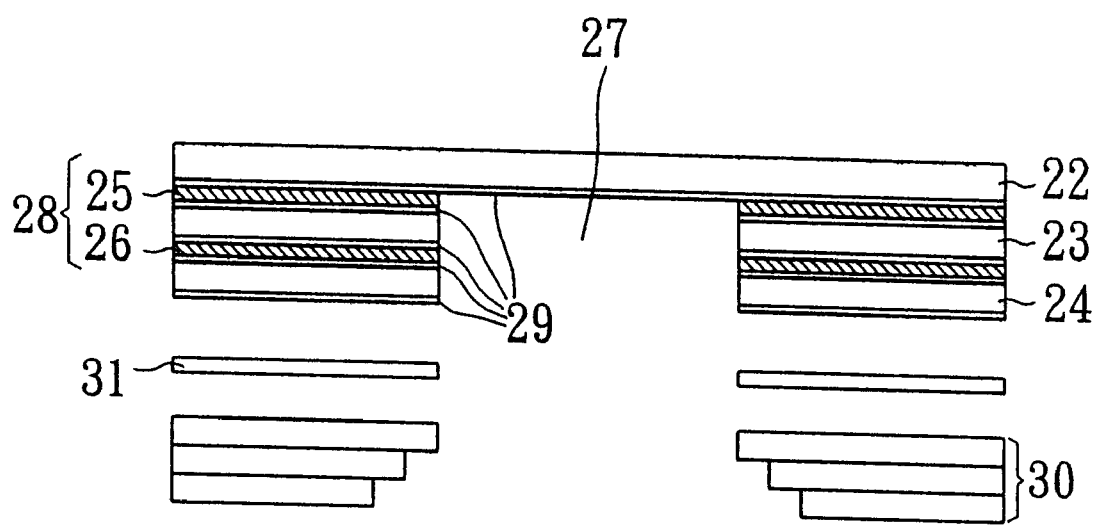
FIG. 6 is an exploded view showing the layers used to construct a cavity down chip carrier having two second thermally conductive sheets in accordance with one embodiment of the present invention

In accordance with a preferred embodiment of the present invention, a stiff heat spreader element may be made by using two or more second thermally conductive sheets. As illustrated in FIG. 6, a second thermally conductive sheet 23 is bonded to a first thermally conductive sheet 22 by using a first bonding sheet 25, which an additional second thermally conductive sheet 24 is bonded to said second thermally conductive sheet 23 using an additional first bonding sheet 26. Also, two second thermally conductive sheets 23 and 24 possess a hole 27 through both sheets 23 and 24 to receive an electronic chip. The adhesion promoter layers 29, e.g. the oxide layers or the coupling agent layers, may also be formed respectively on the surfaces of said first and second. thermally conductive sheets for improving adhesion property. Thus a stiff heat spreader element 28 having two second thermally conductive sheets 23 and 24 is thus constructed. At this stage, said stiff heat spreader element 28 can then be bonded to a plastic circuit substrate 30 with using a second bonding sheet 31 for making a cavity down plastic chip carrier. It should be mentioned that, the same as described earlier, the first bonding sheets 23 and 24 are prepregs, while the second bonding sheet 31 is an adhesive material but not made of a prepreg or prepregs.

Figure 7:
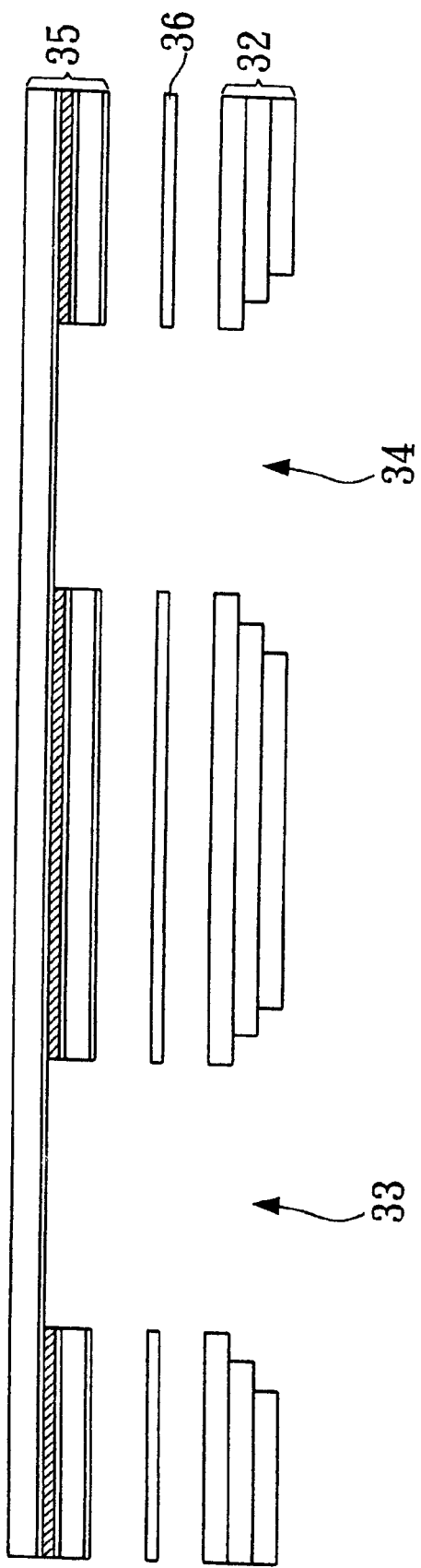
FIG. 7 is an exploded view showing the layers to construct a multichip cavity down chip carrier having a heat spreader element.

In accordance with a preferred embodiment of the present invention, said chip carrier is not limited to a single-chip package but also includes a multichip package. A typical example of multichip packages is shown in FIG. 7. A circuit substrate 32 has two openings 33 and 34, each of which is able to receive a semiconductor chip. Using pressure and heat, a heat spreader sandwich element 35 is attached to said circuit substrate 32 with 35 assistance of a bonding sheet 36, which can then be used to fabricate a two-chip chip carrier.

In accordance with a preferred embodiment of the present invention, said chip carriers may be made by attaching a sandwich element panel to a circuit substrate panel with assistance of a bonding sheet for the purpose of industrial mass production. Said panels may be of any shape or configuration, e.g. strips, etc. However, in such a case, a careful selection of said bonding sheet will become more stringent, since a large size circuit substrate panel naturally magnifies warpage problem.

In accordance with a preferred embodiment of the present invention, said cavity down circuit board (or say substrate) can also carry any other chip type of electronics components, optical components, or optoelectronic components, such as resistors, filters, or oscillators, laser diodes, vertical-cavity surface-emitting laser, etc, which can be easily derived by those skilled in the art.

While novel features of the present invention have been described with reference to one or more particular embodiments herein, those skilled in the art will recognize that many modifications and variations of the present invention are possible. Therefore, the scope of the present invention is to be limited only by the following claims.

What is claimed is:

1. A method of attaching a stiff heat spreader element to a circuit substrate for making a cavity down plastic chip carrier, comprising:
providing a plastic circuit substrate having a first surface and a second surface opposite said first surface, and an opening penetrating through said circuit substrate adapted to receive a chip;
providing a first thermally conductive sheet which serves as a stiff heat spreader element having a first surface and a second surface opposite said first surface;
providing a second thermally conductive sheet having a first surface and a second surface opposite said first surface, and having an opening penetrating through said second thermally conductive sheet for receiving said chip;
providing a first bonding sheet, being at least one layer of prepreg made of fiber-reinforced resin, bonding said first surface of said first thermally conductive sheet to said second surface of said second thermally conductive sheet;
providing a second bonding sheet, being made without a prepreg, bonding said first surface of said second thermally conductive sheet and said second surface of said circuit substrate.

2. The method of claim 1, wherein said first thermally conductive sheet is made of metal.

3. The method of claim 1, wherein said first thermally conductive sheet is made of fiber-reinforced metal.

4. The method of claim 1, wherein said first thermally conductive sheet is made of particulate-reinforced metal.

5. The method of claim 1, wherein said second thermally conductive sheet is made of metal.

6. The method of claim 1, wherein said second thermally conductive sheet is made of fiber-reinforced metal.

7. The method of claim 1, wherein said second thermally conductive sheet is made of metal of particle-reinforced metal.

8. The method of claim 1, wherein said first bonding sheet is made of a stack of prepregs.

9. The method of claim 1, wherein said first bonding sheet is thermally conductive.

10. The method of claim 1, wherein said first bonding sheet is electrically conductive.

11. The method of claim 1, wherein said second bonding sheet is made of an adhesive layer.

12. The method of claim 1, wherein said second bonding sheet is made of a stack of adhesive layers.

13. The method of claim 11, wherein said adhesive layer is made of short fiber-reinforced adhesive material.

14. The method of claim 12, wherein said adhesive layer is made of short fiber-reinforced adhesive material.

15. The method of claim 11, wherein said adhesive layer is made of flake-filled adhesive material.

16. The method of claim 12, wherein said adhesive layer is made of flake-filled adhesive material.

17. The method of claim 11, wherein said adhesive layer is made of particulate-filled adhesive material.

18. The method of claim 12, wherein said adhesive layer is made of particulate-filled adhesive material.

19. The method of claim 1, wherein said second bonding sheet is thermally conductive.

20. The method of claim 1, wherein said second bonding sheet is electrically conductive.

21. A method of attaching a stiff heat spreader element to a circuit substrate for making a cavity down plastic chip carrier, comprising:
providing a plastic circuit substrate having a first surface and a second surface opposite said first surface, and an opening penetrating through said circuit substrate adapted to receive a chip;
providing a first thermally conductive sheet which serves as a stiff heat spreader element having a first surface and a second surface opposite said first surface;
providing a purality of second thermally conductive sheets, each of which has a first surface, a second surface opposite said first surface, and an opening for receiving said chip;
said first surface of said first thermally conductive sheet being bonded to said second thermally conductive sheet with using of a first bonding sheet, being at least one layer of prepreg, placed randomly in between two adjacent thermally conductive sheet; after bonding, said second surface of said first conductive sheet and said first surface of one of said second thermally conductive sheets being exposed to air;
providing a second bonding sheet, being made without a prepreg, bonding said first surface of one of said second thermally conductive sheets and said second surface of said circuit substrate.

22. The method of claim 21, wherein said first thermally conductive sheet is made of metal.

23. The method of claim 21, wherein said first thermally conductive sheet is made of fiber-reinforced metal.

24. The method of claim 21, wherein said first thermally conductive sheet is made of particle-reinforced metal.

25. The method of claim 21, wherein said second thermally. conductive sheet is made of metal.

26. The method of claim 21, wherein said second thermally conductive sheet is made of fiber-reinforced metal.

27. The method of claim 21, wherein said second thermally conductive sheet is made of metal of particle-reinforced metal.

28. The method of claim 21, wherein said fisrt bonding sheet is made a stack of prepregs.

29. The method of claim 21, wherein said first bonding sheet is thermally conductive.

30. The method of claim 21, wherein said first bonding sheet is electrically conductive.

31. The method of claim 21, wherein said second bonding sheet is made of an adhesive layer.

32. The method of claim 21, wherein said second bonding sheet is made of a stack of adhesive layers.

33. The method of claim 31, wherein said adhesive layer is made of short fiber-reinforced adhesive material.

34. The method of claim 32, wherein said adhesive layer is made of short flake-filled adhesive material.

35. The method of claim 31, wherein said adhesive layer is made of short flake-filled adhesive material.

36. The method of claim 32, wherein said adhesive layer is made of short flake-filled adhesive material.

37. The method of claim 31, wherein said adhesive layer is made of particulate-filled adhesive material.

38. The method of claim 32, wherein said adhesive layer is made of short particulate-filled adhesive material.

39. The method of claim 21, wherein said second bonding sheet is thermally conductive.

40. The method of claim 21, wherein said second bonding sheet is electrically conductive.

* * * * *